United States Patent [19]

Kondoh et al.

[11] Patent Number: 5,677,570
[45] Date of Patent: Oct. 14, 1997

[54] SEMICONDUCTOR INTEGRATED CIRCUIT DEVICES FOR HIGH-SPEED OR HIGH FREQUENCY

[75] Inventors: Hiroshi Kondoh, Kodaira; Eiichi Hase, Iruma; Tooru Fujioka, Kokubunji; Kazumichi Sakamoto, Yokohama; Tomio Yamada, Gunma-ken; Toshio Miyamoto, Kodaira; Isao Arai, Takasaki, all of Japan

[73] Assignee: Hitachi, Ltd., Tokyo, Japan

[21] Appl. No.: 602,291

[22] Filed: Feb. 16, 1996

[30] Foreign Application Priority Data

Feb. 17, 1995 [JP] Japan ................... 7-029101

[51] Int. Cl.$^6$ ................... A01L 23/48; A01L 23/52
[52] U.S. Cl. ................... 257/690; 257/691; 257/728; 333/247
[58] Field of Search ................... 257/690, 691, 257/728; 333/247

[56] References Cited

U.S. PATENT DOCUMENTS

| | | | |
|---|---|---|---|
| 5,028,983 | 7/1991 | Bickford et al. | 257/66 |
| 5,256,996 | 10/1993 | Marsland et al. | 333/20 |
| 5,550,406 | 8/1996 | McCormick | 257/666 |

FOREIGN PATENT DOCUMENTS 8-97316   4/1996   Japan .

Primary Examiner—Mahshid D. Saadat
Assistant Examiner—T. M. Arroyo
Attorney, Agent, or Firm—Antonelli, Terry, Stout & Kraus, LLP.

[57] ABSTRACT

A semiconductor integrated circuit device is provided for high-frequency or high-speed circuitry having stabilized characteristics and reduced influence on surrounding devices. In the device structure, ground leads extending from a metal substrate or metal layer for mounting ICs for high-frequency or high-speed circuitry are disposed adjacent to at least one side of signal leads and a width W or a space S of at least a part of the leads are set to inherent values for reducing the inductance of ground leads. Further, passive circuit chips for short-circuiting or blocking a high frequency signal are mounted on the metal substrate to suppress high-frequency component signals flowing through power supply leads and ground leads. According to the structure, a high-frequency potential difference due to the inductance of the ground and power supply leads is suppressed and RF energy is confined within the semiconductor integrated circuit device, so that deterioration of the characteristics of the high-frequency or high-speed ICs can be reduced and leakage of the RF signal to the outside of the semiconductor integrated circuit device can be prevented to avoid influence on surrounding devices.

14 Claims, 6 Drawing Sheets

SEMICONDUCTOR INTEGRATED CIRCUIT DEVICES FOR HIGH-SPEED OR HIGH FREQUENCY

BACKGROUND OF THE INVENTION

1. Field of the Invention

The present invention relates to semiconductor integrated circuit devices, and more particularly to semiconductor integrated circuit devices suitable for integration of high-frequency circuits or high-speed circuits.

2. Description of the Related Art

Recently, there is a tendency that pins and leads used in an IC package are increased due to increased functions of devices in the IC package. Also, there has been a tendency for the width of leads and the space between leads to be narrowed.

FIG. 1A is a plan view showing an example of an integrated circuit having a resin molded structure in which an IC chip is mounted in a SOP (Small Outline Package) type lead frame, of conventional semiconductor integrated circuit devices. FIG. 1B is a sectional view thereof.

In FIGS. 1A and 1B, numeral 9 denotes a tab in which an IC chip 13 is mounted, 10 leads (lead wires or pins), 11 leads connected to the tab, 12 a molding resin, 14 bonding wires for connecting electrodes (pads) formed on the surface of the IC chip with the leads 10 or the tab 9. The leads 10 include inner leads 10a positioned inside of the molding resin 12 and outer leads 10b positioned outside of the molding resin 12.

SUMMARY OF THE INVENTION

In the semiconductor integrated circuit devices for high-frequency circuits which are operated with high-speed signals, it is difficult to keep a metal substrate on which a semiconductor integrated circuit is mounted at the same ground potential as that of a system ground external to the device particularly when the width of leads and the space between leads are narrow, and the characteristics of the semiconductor integrated circuits for high-frequency circuits are deteriorated. An RF potential difference due to inductances of leads used to connect the metal substrate to the system ground effects variation in a potential at the metal substrate, increased interferences of signals in the semiconductor integrated circuit and emission of RF energy to the outside of the semiconductor integrated circuit device.

Further, when a power supply voltage is supplied through leads to the semiconductor integrated circuit for a high-frequency circuit in the semiconductor integrated circuit device, or when the system ground external to the device is connected through leads to the semiconductor integrated circuit for a high-frequency circuit in the device, the RF potential difference due to the inductances of the leads varies the potential at the metal substrate and increases the interferences of the signals in the semiconductor integrated circuit to deteriorate the characteristics of the circuit in the same manner as described above. Further, the RF energy is emitted outside of the semiconductor integrated circuit device.

For example, when it is assumed that a maximum width of a lead is P/2 (mm) and a maximum thickness of the lead is P/2 (mm) where P (mm) is a pitch of the lead and L (mm) is a length of the lead (sum of a length of inner lead and a length of outer lead), an inductive reactance X of the lead in a maximum used frequency fmax (MHz) of a signal is expressed by the following equation (1):

$$X = 2\pi \cdot fmax \cdot 10^{-6} \cdot 0.0002 \cdot L \cdot (\ln(2L/P) + \tfrac{1}{2}) \quad (1)$$

Accordingly, when a characteristic impedance Z0 (Ω) of a system signal line connected to the semiconductor integrated circuit device has a relation defined by the following equation (2), the characteristics are remarkably deteriorated due to the inductance of the lead of the semiconductor integrated circuit device.

$$Z0 < fmax \cdot L \cdot (\ln(2L/p) + \tfrac{1}{2})/40 \quad (2)$$

The above problems occur even in packages of other types such as DIP type, PLCC type, QFP type or the like similarly.

In the prior art, attempts have been made to solve the problems caused by the inductances of the leads by increasing a width of the leads and particularly a width of the ground leads.

It is an object of the present invention to provide a semiconductor integrated circuit device for high-frequency circuitry or high-speed signal circuitry in which an inductance of ground leads is reduced without using heavy leads.

It is another object of the present invention to provide a semiconductor integrated circuit device for high-frequency circuitry or high-speed signal circuitry capable of suppressing deterioration of characteristics of a semiconductor integrated circuit included in the semiconductor integrated circuit device and preventing leakage of RF energy by reducing the effect of inductances of power supply leads and ground leads.

It is another object of the present invention to provide a semiconductor integrated circuit device for high-frequency or high-speed signal circuitry in which a desired impedance matching is attained in signal leads connected to an external circuit and the above objects are also attained.

It is another object of the present invention to provide a semiconductor integrated circuit device for high-frequency circuitry or high-speed signal circuit including outer leads formed into a prescribed array structure and a structure suitable for a resin molded package.

In order to achieve the above objects, the semiconductor integrated circuit device of the present invention comprises an electrically conductive metal substrate (or metal layer), a plurality of signal and power supply leads disposed around the metal substrate, a semiconductor integrated circuit chip for high-frequency circuitry mounted on the metal substrate and including a plurality of electrodes disposed in the surface of the chip, and wiring members for connecting the electrodes in the surface of the semiconductor integrated circuit chip with inner end portions of the signal or power supply leads. The metal substrate includes leads extending from the metal substrate in close vicinity to at least one side of a signal lead. The extending lead includes, in at least a part thereof, an inherent lead width or an inherent space between the extending lead and an adjacent signal or power supply lead designed to keep the ground potential stable at a high frequency without influence of a high-frequency signal propagated through the signal or power supply lead.

More particularly, in at least a part of the ground lead extending from the metal substrate, a width W1 is formed to be W1>0.7 (W2/2+S) where W2 is a width of the signal or power supply lead and S is the width of a gap between opposite end surfaces of the signal or power supply lead and the extending ground lead adjacent to the signal or power supply lead.

According to a preferred aspect of the present invention, the leads for ground, signal and power supply can achieve the above objects while including an arrangement of the prescribed lead width and space standardized already, for example, in a general-purpose LSI in respective outer end portions and the signal lead can be further designed to have an inherent width to attain the impedance matching.

According to another aspect of the present invention, at least one condenser, resistor, inductor or a passive circuit chip having these elements integrated therein is mounted on the metal substrate and the electrodes formed in the surface of the semiconductor integrated circuit chip are connected to the metal substrate or the power supply lead through the passive circuit chip to thereby prevent a high-frequency current from flowing through the ground lead and keep the metal substrate to the ground potential at a high frequency. Further, radiation and leakage of RF energy to the outside of the semiconductor integrated circuit device through the lead can be prevented.

According to still another aspect of the present invention, the metal substrate, the semiconductor integrated circuit chip and the wiring member are covered by molding material except parts continuing to the outer leads of the lead members and a width or a space in the inner leads covered by the molding material is adjusted, so that the structure for establishing the ground potential of the metal substrate and matching the impedance of the signal line can be realized. According to a preferred embodiment, the leads are bent in at least one portion thereof so that ends of the respective outer leads are positioned to be protruded from the primary surface of the molding material.

According to the present invention, the ground lead extending from the metal substrate is disposed adjacent to at least one side of the signal lead and the line width W1 in at least a part of the ground lead is formed to be an inherent value, more particularly, $W1 > 0.7(W2/2+S)$ where W2 is a width of the signal or power supply lead and S is a width of a gap between opposite ends of the signal or power supply lead and the extending ground lead adjacent thereto, so that the ground lead can be stabilized to the ground potential at high frequency and an equivalent inductance of the ground lead can be reduced. Accordingly, according to the present invention, the metal substrate can be used as the effective ground plane and deterioration of the characteristics of the semiconductor integrated circuit chip due to the ground inductance can be reduced. Further, with the above structure, the impedance matching of the signal lead can be attained and the problem caused by reflection of the high-frequency signal in the signal lead can be reduced. Further, radiation and leakage of the RF energy to the surrounding space of the semiconductor integrated circuit device due to the high-frequency current flowing through the lead can be prevented.

Further, according to the present invention, the ground lead is formed integrally with the metal substrate on which the semiconductor integrated circuit chip is mounted and a part of the integral portion is formed to be extended, so that the inexpensive packaging using the resin mold can be realized. Adjustment of the space and the width of the leads for establishment of the ground potential and the impedance matching is performed by the inner leads, so that the width and the space of the outer leads can be formed into the prescribed array structure in the same manner as other general purpose LSIs.

Furthermore, in the preferred aspect of the present invention, additional chips of condensers, resistors, inductors or circuits having these elements integrated therein are mounted on the metal substrate and the electrode pads on the IC chip for high-frequency circuit are connected to the power supply leads or the metal substrate for ground through the additional chips, so that the RF signal component produced within the IC chip is prevented from leak from leads other than input/output leads to the outside. With the above structure, the RF energy produced within the device can be confined within the semiconductor integrated circuit device to prevent influence to other surrounding circuit devices and the electrical characteristics of the inner circuit of the device can be maintained to be more satisfactory.

The foregoing and other objects, advantages, manner of operation and novel features of the present invention will be understood from the following detailed description when read in connection with the accompanying drawings.

DESCRIPTION OF THE PREFERRED EMBODIMENTS

Figure 1A:
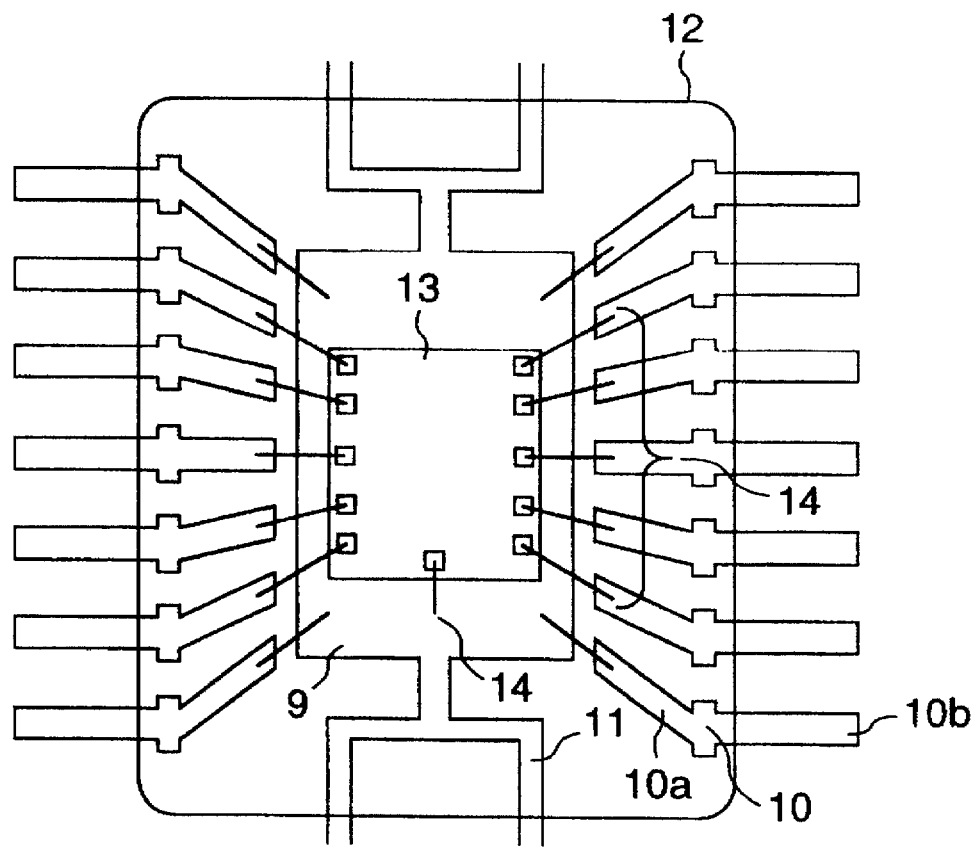
FIGS. 1A and 1B are a plan view and a sectional view showing an example of a conventional semiconductor integrated circuit device, respectively.
Figure 1B:
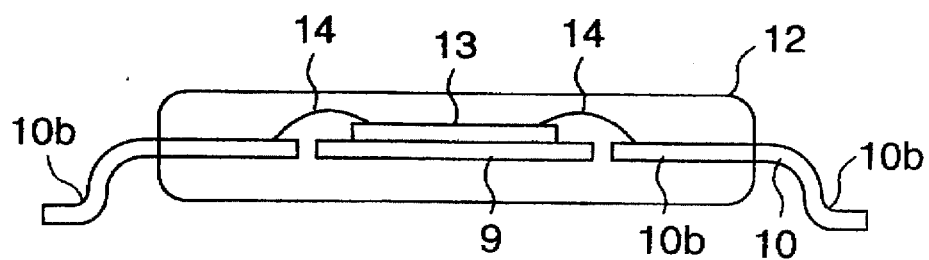
Figure 2:
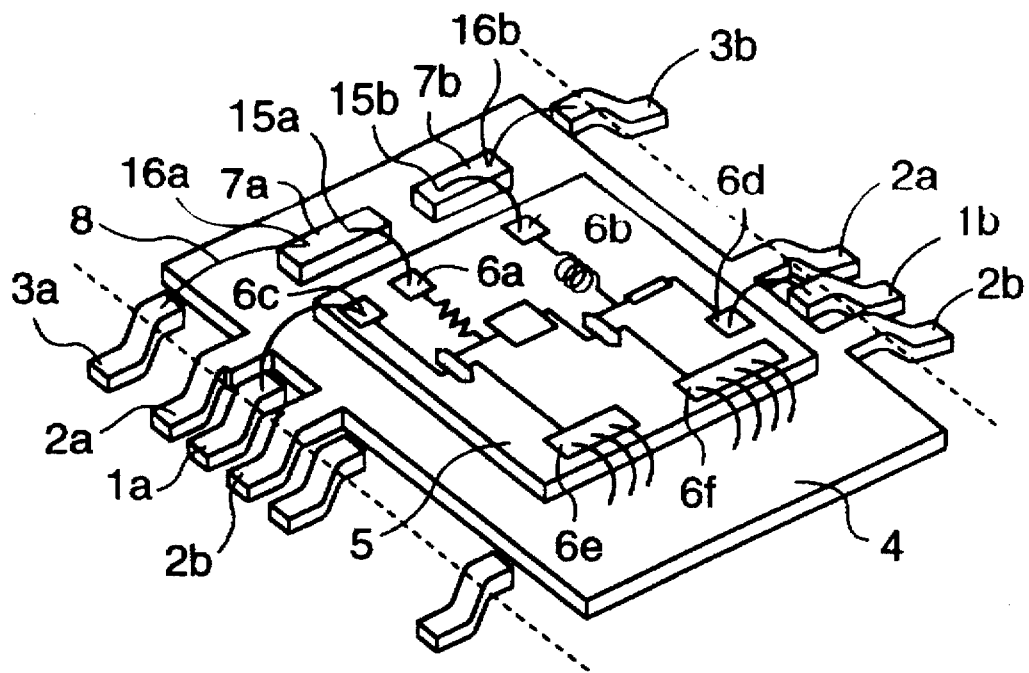
FIG. 2 is a perspective view showing an embodiment of a semiconductor integrated circuit device according to the present invention.

FIG. 2 shows an embodiment of a semiconductor integrated circuit device of the present invention using a lead frame tab of a surface mounted flat package TSSOP (thin shrink small outline package) type.

In FIG. 2, numeral 1 (1a, 1b) denotes signal leads, 2 (2a, 2b) ground leads (hereinafter referred to as GND leads) disposed at both sides of the signal leads, and 3 (3a, 3b) bias supply leads (power supply lead). In the embodiment, the GND leads 2 are formed integrally with a metal tab (metal substrate) 4 having the electrical conductivity. Numeral 5 denotes a semiconductor integrated circuit (hereinafter referred to as IC) mounted on the tab 4 and including a high-frequency and/or high-speed signal circuit constituted by circuit elements formed by the semiconductor technique. A plurality of electrode pads 6 (6a to 6f) are formed on the surface of the IC 5.

Figure 3A:
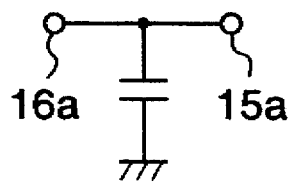
FIGS. 3A and 3B show an example of an equivalent circuit schematically illustrating an additional chip.
Figure 3B:
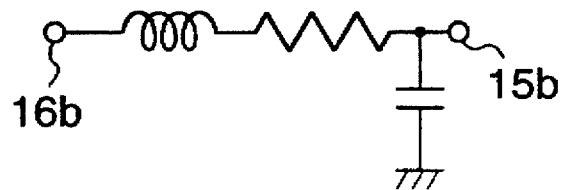

In the embodiment, numeral 6a and 6b represent electrode pads for power supply, 6c and 6d electrode pads for signals, 6e and 6f electrode pads for ground. Further, numeral 7 (7a, 7b) denotes an additional chip including a condenser or the like mounted on the metal substrate 4. Examples of equivalent circuits of the additional chips 7 are illustrated in FIGS. 3A and 3B. The ground of the additional chip is coincident with the metal substrate 4. Numeral 8 denotes bonding wires which are sealed by resin mold. The leads 1, 2 and 3 are bounded by a side of the resin mold shown by broken line and include outer leads positioned outside of the resin mold and inner leads positioned inside of the resin mold.

In the embodiment, adjustment of a space of the signal lead 1 and a width of the GND lead 2 is made in the respective inner leads to thereby establish the ground potential of the GND lead 2 and at the same time the RF impedance matching of the signal lead 1 is attained by adjustment of a width of the signal lead 1. Definite examples thereof will be described later with reference to FIGS. 4 to 6.

In the embodiment, the power supply pads 6a and 6b are connected through the additional chips 7a and 7b to the bias supply leads 3a and 3b, respectively. In this manner, the additional chips for bypassing or blocking the high-frequency signal are disposed within the semiconductor integrated circuit device to confine the high-frequency signal in the package, so that the metal substrate 4 can be used as the stable ground. The ground pads 6e and 6f are connected to the metal substrate 4 by using a plurality of bonding wires in parallel in order to reduce an inductance component of the bonding wires to stabilize the circuit characteristics.

In a conventional device, for example, a chip condenser is connected between a bias lead and the ground at the outside of the integrated circuit package. Accordingly, the characteristics of the semiconductor integrated circuit are deteriorated due to a voltage drop caused by a high-frequency current flowing through the bias lead and the ground lead. Further, the high-frequency energy is radiated to the outside of the package to influence another circuit device mounted near the semiconductor integrated circuit device to form one factor of deteriorating the circuit characteristics. With the structure of the embodiment, the above disadvantages are solved.

The structure of the embodiment can be realized by modifying the shape of the lead frame of the conventional surface mounted plastic package TSSOP type and mounting primary IC chips and additional chips in the tab, for example. Accordingly, mass production by automatization can be attained easily and the device can be provided at an inexpensive fabricating cost.

Figure 4:
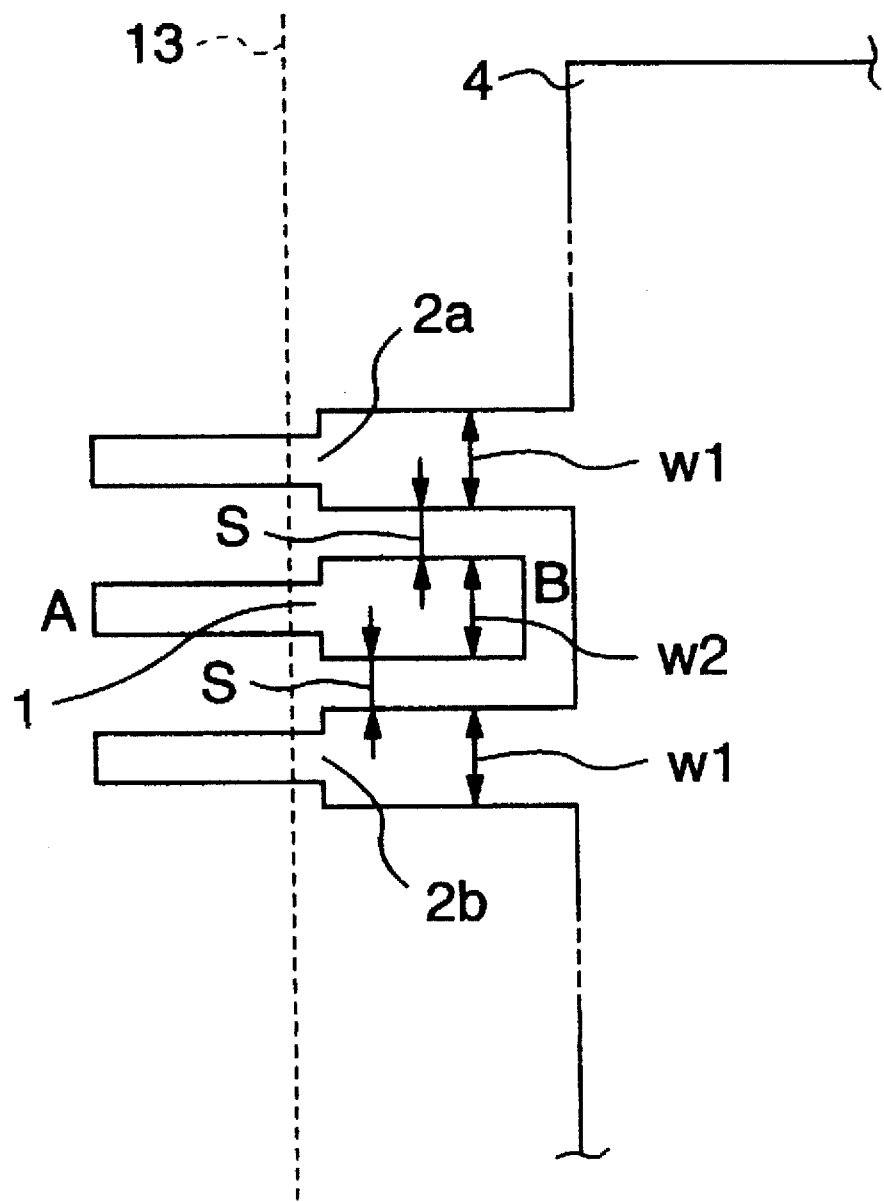
FIG. 4 illustrates an embodiment of a lead structure for attaining reduction of inductances of ground leads.

FIG. 4 is a plan view showing a portion of a lead frame of the TSSOP type.

FIG. 4 shows the tab 4, one signal lead 1 independent of the tab, and a set of GND leads 2 (2a, 2b) positioned at both sides of the signal lead and extending from the tab, and other leads are omitted. Broken line 13 represents a boundary of the resin mold. In the standard TSSOP type package, for example, a pitch between adjacent leads is 0.65 mm, a thickness of leads is about 0.17 mm, a length and a width of outer leads are about 0.9 mm and about 0.22 mm, respectively, a length of inner leads is about 1.06 mm, and a distance between edges of the inner leads of the GND leads 2a and 2b which are not opposite to the signal lead is about 1.68 mm (2·W1+2·S+W2 in FIG. 4).

When widths of the inner leads of the signal lead 1 and the GND lead 2 are W2 and W1, respectively, and a space between the inner leads of the signal lead 1 and the GND lead 2 is S, W1>0.7×(W2/2+S) is merely required to be satisfied in order to assure the ground potential of the GND lead. At the same time, in order to match the signal lead 1 to 50Ω without changing a shape of the outer lead having the characteristic impedance of the signal lead equal to about 140Ω, the size of leads is required to be designed so that the characteristic impedance of the inner lead is about 30Ω.

For example, when the width W2 of the inner lead of the signal lead is selected to be 0.25 mm, the space S between the inner lead and the adjacent GND lead 2 is about 0.09 mm and the width W1 of the inner lead of the GND lead 2 is about 0.62 mm, the above inequality can be satisfied sufficiently to reduce the inductance of the GND lead and at the same time the impedance matching can be attained.

Figure 5:
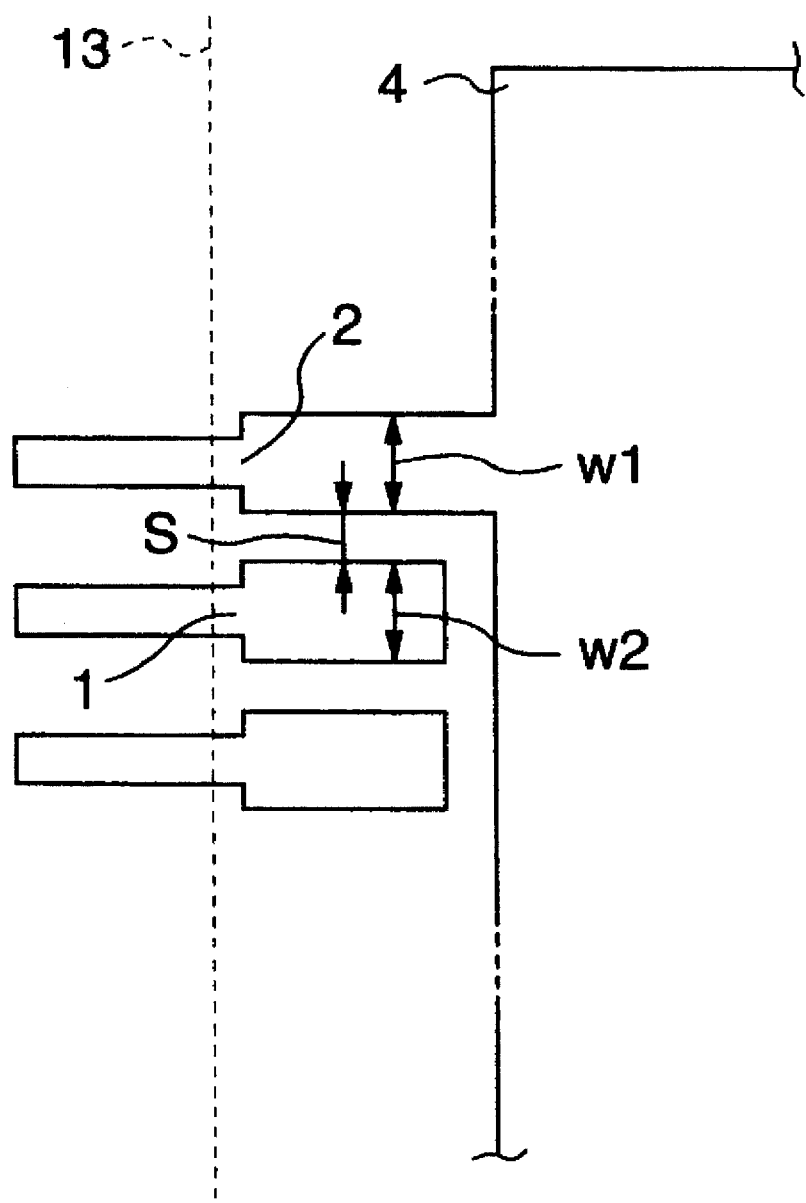
FIG. 5 illustrates another embodiment of a lead structure for attaining reduction of inductances of ground leads.

FIG. 5 illustrates an example in which the GND lead 2 is disposed only at one side of the signal lead to reduce the ground inductance and at the same time realize the impedance matching.

In the above structure, it is assumed that a pitch of leads, a thickness of leads, a length and a width of outer leads, and a length of inner leads are the same as those of the embodiment of FIG. 4, a distance between an edge of the inner lead of the signal lead 1 which is not opposite to the GND lead 2 and an edge of the inner lead of the GND lead 2 which is not opposite to the signal lead 1 (distance equal to W1+W2+S in FIG. 5) is fixed to about 1.03 mm which is the same as that of the general purpose TSSOP type package, and a shape of the inner leads is adjusted.

In order to assure the RF ground potential of the GND lead, W1>0.7×(W2/2+S) is merely required to be satisfied. Further, in order to match the impedance of the signal line 1 to 75Ω without changing the shape of the outer lead, when the width W2 of the inner lead of the signal lead 1 is selected to be 0.25 mm, for example, it is necessary that the distance S between the signal lead 1 and the GND lead 2 is about 0.11 mm and the width W1 is 0.67 mm. At this time, the above inequality can be satisfied sufficiently and the inductance of the GND lead can be reduced.

Figure 6:
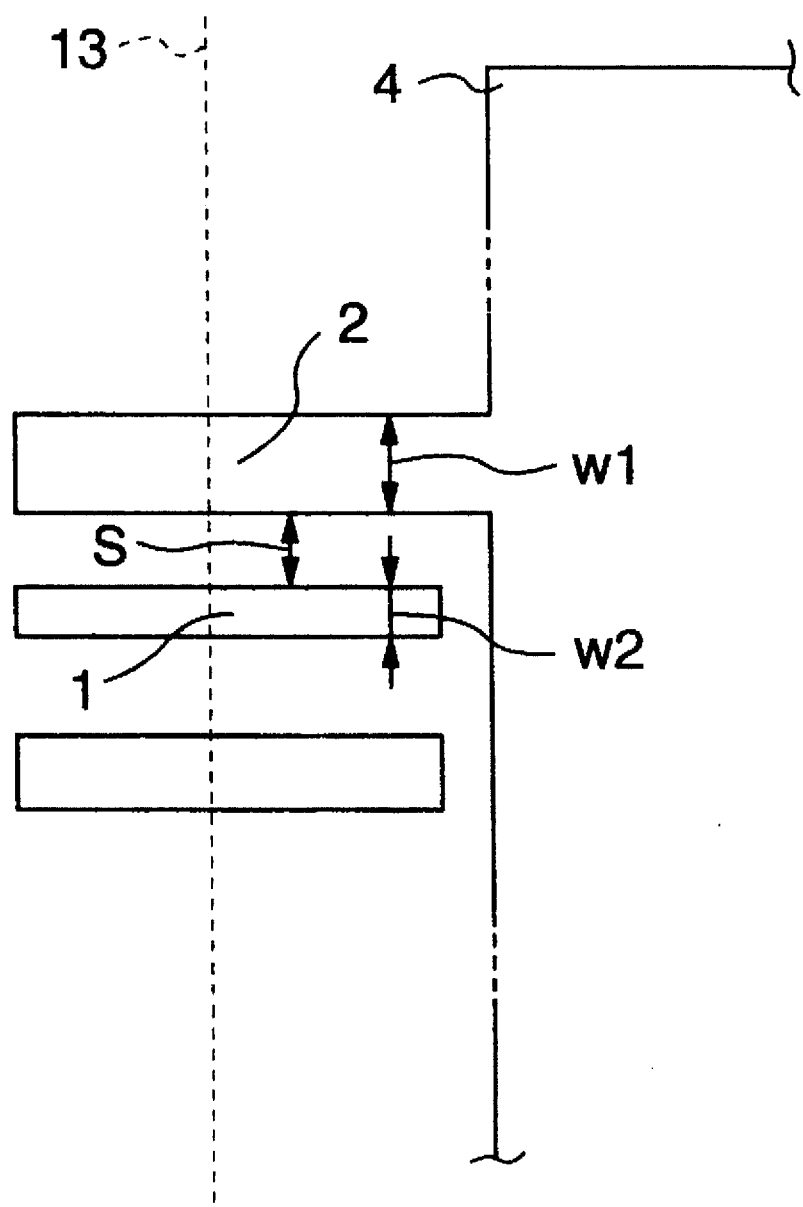
FIG. 6 illustrates still another embodiment of a lead structure for attaining reduction of inductances of ground leads.

FIG. 6 shows an example of a lead structure according to another embodiment of the present invention in which the inner lead and the outer lead have the same width in the general purpose TSSOP type package and reduction of the ground inductance and impedance matching are attained.

For example, when a distance between an edge of the signal lead 1 which is not opposite to the GND lead 2 and an edge of the GND lead 2 which is not opposite to the signal lead 1 (W1+W2+S in FIG. 6) is fixed to 1.03 mm, the GND lead satisfies the above inequality W1>0.7×(W2/2+S) to assure the stability of the ground potential. At the same time, in order to match the characteristic impedance of the signal lead 1 to a specification value of 75Ω, when the width W2 of the signal lead 1 is selected to 0.25 mm, for example, it is necessary that the distance S between the signal lead 1 and the GND lead 2 is about 0.20 mm and the width W1 is 0.58 mm.

Figure 7:
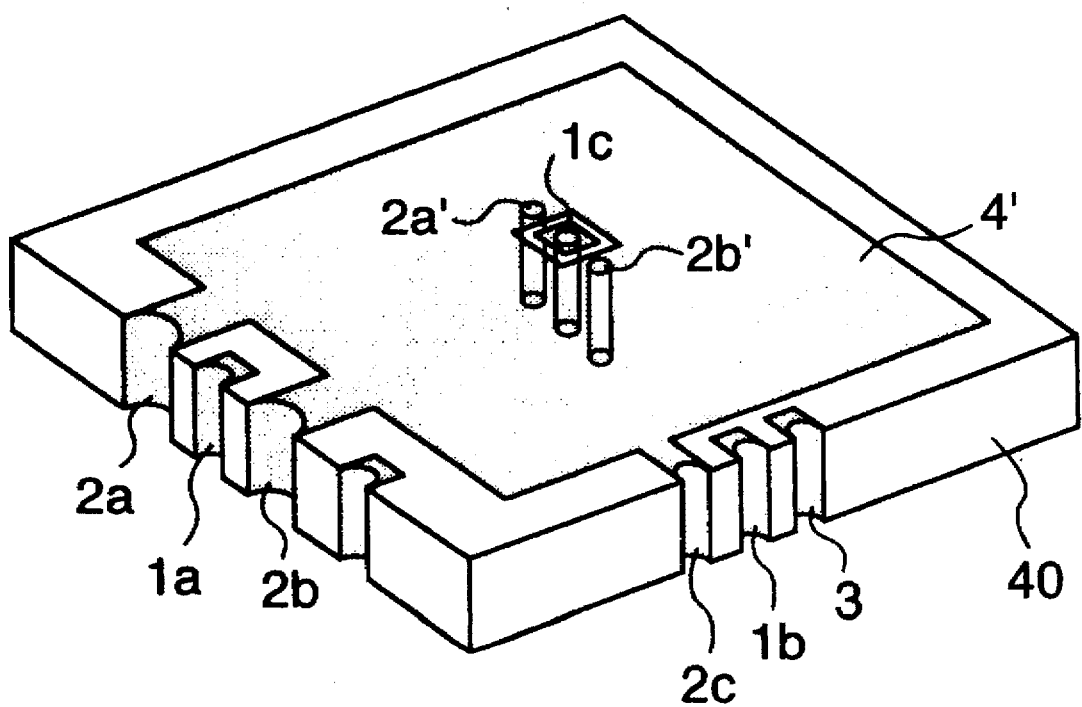
FIG. 7 is a perspective view illustrating a substrate showing another embodiment of a semiconductor integrated circuit device according to the present invention.

FIG. 7 illustrates still another embodiment of the present invention showing an example of a semiconductor integrated circuit device adopting an LCC type package.

Numeral 40 denotes an insulating substrate of ceramic or the like having the surface in which a metal layer 4' constituting a mounting area of IC chips is formed and the sides in which a plurality of leads for connecting signal lines, power supply lines or ground lines externally of the package are provided. Numerals 1 (1a, 1b) denote signal leads, and numerals 2 (2a, 2b, 2c) denotes GND leads which are formed by extending part of the metal layer 4' to the sides of the substrate.

Numeral 1c denotes a signal lead formed to penetrate the substrate 40 from the upper surface to the rear surface thereof in the formation area of the metal layer 4'. A metal layer on the surface of a small area independent of the metal layer 4' constitutes an electrode connected to the signal lead 1c. Numerals 2a' and 2b' denote GND leads formed at both sides of the signal lead 1c and which penetrate the substrate 40 from the upper surface to the rear surface thereof and are connected to the metal layer 4' of the upper surface. The leads 1c, 2a' and 2b' are formed by filling the holes penetrating the substrate with electrical conductors or by covering the inner surface of the penetrating holes with electrically conductive material.

Even in the above structure, when the widths or the diameters of the signal lead 1 and the GND lead 2 are W2 and W1, respectively, and a space between the signal lead 1 and the GND lead 2 is S, W1>0.7×(W2/2+S) is merely required to be satisfied in order to assure the RF ground potential of the GND lead.

In the above embodiments, two types of packages have been described, while the present invention can be also applied to the semiconductor integrated circuit device adopting DIP type, PLCC type, QFP type, PGA type or other type IC packages.

As apparent from the above description, according to the semiconductor integrated circuit device structure of the present invention, the inductance of the ground lead adjacent to the signal lead can be reduced to thereby establish the stable ground potential at the metal surface on which the semiconductor integrated circuits are mounted and which is connected to the ground lead. Further, deterioration of the characteristics of the high-frequency semiconductor integrated circuit and radiation and leakage of the RF signal energy and the high-speed signal energy produced in the semiconductor integrated circuit device can be prevented and matching of the RF impedance of the signal leads can be attained.

Furthermore, the additional passive circuit chips are mounted on the metal substrate or the metal layer in the semiconductor integrated circuit device in which the IC chips for high-frequency circuits are mounted and the RF signal energy and the high-speed signal energy produced in the device can be confined in the device to thereby suppress deterioration of the characteristics of the semiconductor integrated circuit due to the RF current flowing through the power supply leads and the ground leads and radiation and leakage of the signal energy to the outside of the device so that interference to other circuit devices can be avoided.

We claim:

1. A semiconductor integrated circuit device comprising:
   an electrically conductive metal substrate;
   signal leads disposed around said metal substrate;
   power supply leads disposed around said metal substrate;
   an IC chip for high-frequency circuitry mounted on said metal substrate and including ground electrodes, signal electrodes and power supply electrodes disposed in a surface of said IC chip; and
   first wiring members for electrically connecting said signal electrodes with said signal leads;
   wherein said metal substrate includes ground leads extending in parallel to said signal leads; and
   wherein a width W1 of at least one of said ground leads is W1>0.7(W2/2+S), where W2 is a width of one of said signal leads and S is a space between said one of said signal leads and said one of said ground leads.

2. A semiconductor integrated circuit device according to claim 1, further comprising:
   a passive circuit chip mounted on said metal substrate;
   wherein said power supply electrodes and said power supply leads are electrically connected through said passive circuit chip to each other.

3. A semiconductor integrated circuit device according to claim 2, wherein
   said ground electrodes are connected in parallel to said metal substrate by means of a plurality of second wiring members.

4. A semiconductor integrated circuit device according to claim 3, wherein
   said metal substrate, said signal leads, said power supply leads, said IC chip for high-frequency circuitry, said first wiring members and said second wiring members are covered by molding resin except parts of said ground leads, said signal leads and said power supply leads.

5. A semiconductor integrated circuit device comprising:
   an electrically conductive metal substrate;
   signal leads disposed around said metal substrate;
   power supply leads disposed around said metal substrate;
   an IC chip for high-frequency circuitry mounted on said metal substrate and including ground electrodes, signal electrodes and power supply electrodes disposed in a surface of said IC chip; and
   first wiring members for electrically connecting said signal electrodes with said signal leads;
   wherein said metal substrate includes ground leads extending in parallel to said signal leads;
   wherein said metal substrate, said signal leads, said power supply leads, said IC chip for high-frequency circuitry, said first wiring members and said second wiring members are covered by molding resin except portions of said ground leads, said signal leads and said power supply leads;
   wherein said first wiring member is connected to a portion of said signal leads covered by said molding resin; and
   wherein a width W1 of at least one of said ground leads is W1>0.7(W2/2+S) in said portion covered by said molding resin, where W2 is a width of one of said signal leads and S is a space between said one of said signal leads and said one of said ground leads.

6. A semiconductor integrated circuit device according to claim 5, further comprising:
   a passive circuit chip mounted on said metal substrate and covered by said molding resin;
   wherein one electrode on said passive circuit chip is electrically connected to said power supply electrode and other electrodes on said passive circuit chip are electrically connected to said power supply leads.

7. A semiconductor integrated circuit device according to claim 6, wherein
   said ground leads, said signal leads and said power supply leads include the width and the space prescribed by general-purpose standards for a TSSOP type package in portions which are not covered by said molding resin.

8. A semiconductor integrated circuit device according to claim 7, wherein
   said ground electrodes are connected in parallel to said metal substrate by means of a plurality of second wiring members.

9. A semiconductor integrated circuit device comprising:
   an electrically conductive metal substrate;
   signal leads disposed around said metal substrate;
   power supply leads disposed around said metal substrate;
   an IC chip for high-frequency circuitry mounted on said metal substrate and including ground electrodes, signal electrodes and power supply electrodes disposed in a surface of said IC chip; and
   first wiring members for electrically connecting said signal electrodes with said signal leads;
   wherein said metal substrate includes two ground leads extending at both sides of said signal leads and in parallel to said signal leads;
   wherein said metal substrate, said signal leads, said power supply leads, said IC chip for high-frequency circuitry, said first wiring members and said second wiring members are covered by molding resin except portions of said ground leads, said signal leads and said power supply leads;

wherein said first wiring member is connected to a portion of said signal leads covered by said molding resin;

wherein a width W1 of at least one of said ground leads is W1>0.7(W2/2+S) in said portion covered by said molding resin, where W2 is a width of one of said signal leads and S is a space between said one of said signal leads and said one of said ground leads.

10. A semiconductor integrated circuit device according to claim 9, further comprising:

a passive circuit chip mounted on said metal substrate and covered by said molding resin;

wherein one electrode on said passive circuit chip is electrically connected to said power supply electrode and other electrodes on said passive circuit chip are electrically connected to said power supply leads.

11. A semiconductor integrated circuit device according to claim 10, wherein said ground leads, said signal leads and said power supply leads include the width and the space prescribed by general-purpose standards for a TSSOP type package in portions which are not covered by said molding resin.

12. A semiconductor integrated circuit device according to claim 11, wherein said ground electrodes are connected in parallel to said metal substrate by means of a plurality of second wiring members.

13. A semiconductor integrated circuit device comprising:

an electrically conductive metal substrate;

signal leads disposed around said metal substrate;

ground leads extending from said metal substrate, respectively disposed adjacent to a side of each of said signal leads;

an IC chip for high-frequency circuitry mounted on said metal substrate;

first wiring members for electrically connecting signal electrodes formed on a surface of said IC chip with said signal leads; and second wiring members for electrically connecting ground electrodes formed on a surface of said IC chip with said ground leads;

wherein a width W1 of one of said ground leads is W1>0.7(W2/2+S), where W2 is a width of one of said signal leads adjacent to said one of said ground leads and S is a space between said one of said signal leads and said one of said ground leads.

14. A semiconductor integrated circuit device comprising:

an electrically conductive metal substrate;

signal leads disposed around said metal substrate;

ground leads extending from said metal substrate, disposed adjacent to a side of each of said signal leads;

an IC chip for high-frequency circuitry mounted on said metal substrate;

first wiring members for electrically connecting signal electrodes formed on a surface of said IC chip with said signal leads; and second wiring members for electrically connecting ground electrodes formed on a surface of said IC chip with said ground leads;

wherein said metal substrate, said IC chip, said first wiring members and second wiring members are covered by a resin mold;

wherein each of said signal leads and ground leads includes an outer lead positioned outside of said resin mold and an inner lead positioned inside of said resin mold; and wherein a width W1 of said inner lead of said ground lead is W1>0.7(W2/2+S), where W2 is a width of said inner lead of said one of said signal leads and S is a space between said inner lead of said one of said signal leads and the inner lead of one of said ground leads adjacent to said one of said signal leads.

* * * * *